(12) United States Patent
Pritchard et al.

(10) Patent No.: US 10,727,108 B2
(45) Date of Patent: Jul. 28, 2020

(54) DUMMY GATE ISOLATION AND METHOD OF PRODUCTION THEREOF

(71) Applicant: GLOBALFOUNDRIES Inc., Grand Cayman (KY)

(72) Inventors: David Pritchard, Glenville, NY (US);
Heng Yang, Rexford, NY (US);
Hongru Ren, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/168,414

(22) Filed: Oct. 23, 2018

(65) Prior Publication Data

US 2020/0127013 A1  Apr. 23, 2020

(51) Int. Cl.

| | | |
|---|---|---|
| *H01L 21/762* | (2006.01) | |
| *H01L 21/84* | (2006.01) | |
| *H01L 29/08* | (2006.01) | |
| *H01L 21/027* | (2006.01) | |
| *H01L 29/66* | (2006.01) | |
| *H01L 27/12* | (2006.01) | |
| *H01L 21/285* | (2006.01) | |
| *H01L 29/78* | (2006.01) | |

(52) U.S. Cl.
CPC .... *H01L 21/76283* (2013.01); *H01L 21/0271* (2013.01); *H01L 21/28518* (2013.01); *H01L 21/76289* (2013.01); *H01L 21/84* (2013.01); *H01L 27/1203* (2013.01); *H01L 29/0847* (2013.01); *H01L 29/66545* (2013.01); *H01L 29/66568* (2013.01); *H01L 29/78* (2013.01)

(58) Field of Classification Search
CPC ......... H01L 21/76283; H01L 29/66568; H01L 29/78; H01L 27/1203; H01L 21/28518; H01L 21/76289
See application file for complete search history.

(56) References Cited

U.S. PATENT DOCUMENTS

| | | | |
|---|---|---|---|
| 8,609,510 B1 | 12/2013 | Banna et al. | |
| 9,412,616 B1 | 8/2016 | Xie et al. | |
| 9,917,103 B1* | 3/2018 | Mulfinger | ........... H01L 27/1203 |
| 2013/0043535 A1 | 2/2013 | Anderson et al. | |
| 2016/0163604 A1 | 6/2016 | Xie et al. | |

* cited by examiner

*Primary Examiner* — Anthony Ho

(74) *Attorney, Agent, or Firm* — Ditthavong & Steiner, P.C.

(57) ABSTRACT

The present disclosure relates to an isolation region between semiconductor devices and methods of fabrication. Embodiments include device having a silicon-on-insulator (SOI) substrate; a dummy gate between two metal gates formed over the SOI substrate, the dummy gate providing a physical diffusion break between the two metal gates; raised source/drain (S/D) regions formed on sides of the metal gates; and interlayer dielectric formed over the dummy gate, raised S/D regions and metal gates and in openings on sides of the dummy gate.

5 Claims, 6 Drawing Sheets

DUMMY GATE ISOLATION AND METHOD OF PRODUCTION THEREOF

TECHNICAL FIELD

The present disclosure relates to semiconductor devices, including integrated circuits (ICs). The present disclosure is particularly applicable to an isolation region between semiconductor devices and methods of fabrication.

BACKGROUND

Fully depleted silicon-on-insulator (FDSOI) with a gate first processing utilizes a continuous shallow trench isolation (STI) dummy gate tie down to voltage drain drain (VDD) to form circuit isolation on p-channel field-effect transistor (PFET), due to a lightly doped drain (LDD) drop from silicon germanium (SiGe) strain relaxation at the STI region edge. This OFF device introduces higher leakage compared to a physical diffusion break. In addition, area is lost due to the need for filler cells that separate drain/drain abutment. An active layer filler, such as a STI, is needed to insert voltage source source (VSS) between two separate drains which decreases available area.

A need therefore exists for devices and related method to provide dummy gate isolation with a physical active layer cut which avoids the continuous active layer filler for gate first FDSOI.

SUMMARY

An aspect of the present disclosure is a device including an isolation region formed with a shallow/selective spacer etching process.

Another aspect of the present disclosure is a method for forming a device including physical diffusion break over a silicon-on-insulator (SOI) substrate with gate first FDSOI processing.

According to the present disclosure, some technical effects may be achieved in part by a device including a SOI substrate, a dummy gate formed between two metal gates and formed over the SOI substrate. The dummy gate provides a physical diffusion break between the two metal gates. Raised source/drain (S/D) regions are formed on sides of the metal gates. An interlayer dielectric (ILD) is formed over the dummy gate, the raised S/D regions and the metal gates, as well as in openings on sides of the dummy gate.

Another aspect of the present disclosure is a method including forming a dummy gate with spacers and S/D regions between two metal gates over a SOI substrate. A mask is formed over the dummy gate, metal gates and S/D regions. A first opening is formed over the dummy gate. A second opening is formed below the first opening to remove at least the spacers from sides of the dummy gate. A third opening is formed into the SOI substrate and removes a portion of the S/D region of the dummy gate.

Another aspect of the present disclosure is a method including forming a dummy gate with nitride spacers and S/D regions between two metal gates over a SOI substrate. A mask is formed over the dummy gate, metal gates and S/D regions. A first opening is formed over the dummy gate. A second opening is formed with a selective spacer etch below the first opening to remove at least the nitride spacers from sides of the dummy gate. A third opening is formed with a selective silicon etch into the SOI substrate and removes a portion of the S/D region of the dummy gate. The remaining portion of the mask is removed. An interlayer dielectric is formed over the dummy gate, metal gates and S/D regions and along sides of the dummy gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of voltage leakage and decreased area margins attendant upon a continuous active layer filler in FDSOI devices, including FDSOI PFET. The problem is solved, inter alia, by forming a physical diffusion break by way of shallow/selective spacer etch.

Methodology in accordance with embodiments of the present disclosure includes a dummy gate spacer being etched by way of a mask to selectively remove material around the dummy gate and create and opening on either side of the dummy gate. Both sides of the dummy gate are opened to accommodate a larger critical dimension of the mask opening to improve manufacturability. The openings left by the removal of the spacers are then isotropically etched with a selective silicon etch to confine the SOI substrate layer below the spacer on either side of the dummy gate thereby creating a physical diffusion break.

In certain embodiments, the dummy gate height is eroded, which facilitates subsequent IDL fill for contacts. The dummy gate can be completely removed to further improve void formation. The mask process may be done pre- or post-salicide of the S/D regions. A pre-salicide process will have a separate fill step for the dummy area to protect the sides of the eroded dummy gate from causing defects.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects.

Accordingly, the drawings and description are to be regarded as illustrative in nature, and not as restrictive.

FIGS. 1A through 1F schematically illustrates cross-sectional views of a process flow for forming physical diffusion break in gate first FDSOI, in accordance with an exemplary embodiment.

Figure 1A:
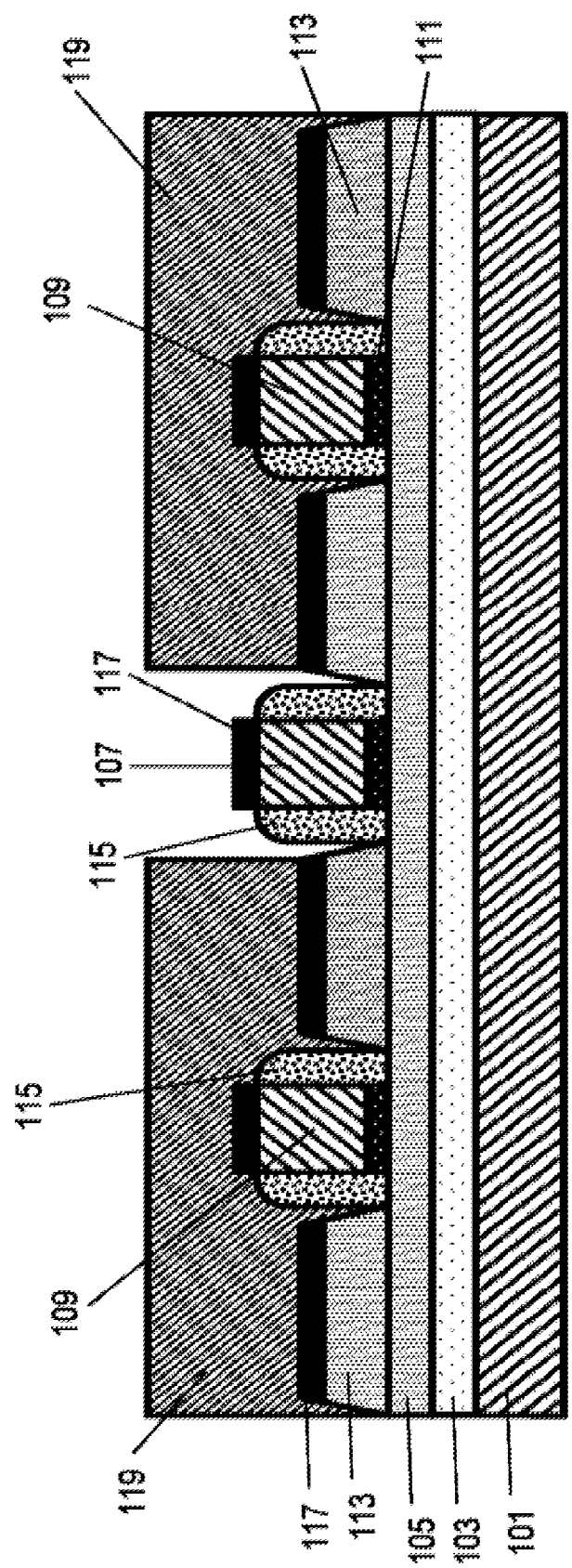
FIGS. 1A through 1F schematically illustrates cross-sectional views of a process flow for forming physical diffusion break in gate first FDSOI, in accordance with an exemplary embodiment.

In FIG. 1A, the substrate is SOI substrate, including bottom silicon layer 101, buried oxide (BOX) layer 103, and top silicon layer 105. Dummy gate 107 as well as high-k metal gates (HKMGs) 109 are located on top silicon layer 105. A gate dielectric layer 111 is formed underneath dummy gate 107 and HKMGs 109. The dummy gate structure 107 may be polysilicon in some embodiments. The gate dielectric layer 111 may be any appropriate dielectric material.

The semiconductor structures include raised source/drain regions 113 located on either side of the dummy gate 107 and HKMGs 109. A selective epitaxial silicon layer is grown in the S/D region after spacers 115 are formed to form the raised S/D regions 113. In alternative embodiments, the masking process (discussed below) can be performed prior to the raised S/D regions being formed, but an additional fill step for the dummy gate is needed to protect the sides of the eroded dummy gate 107. Spacers 115 are formed on either side of the dummy gate 107 and HKMGs 109. Spacers 115 can be formed of silicon nitride (SiN). Silicide layer 117 is provided such that post silicide isolation can be performed. Silicide layer 117 is formed over the raised S/D regions and tops of dummy gate 107 and HKMG 109.

In FIG. 1A, mask 119 is deposited and an opening is formed over the dummy gate 107 and partially along sides of the spacers 115. The mask 119 includes a lithography stack of an organic photoresist with anti-reflective coating (not shown for illustrative convenience) on a hard mask. The hard mask can be a nitride or oxide material. For 20 nanometer (nm) and below technology nodes, the hard mask is an immersion mask which can meet required geometry.

Figure 1B:
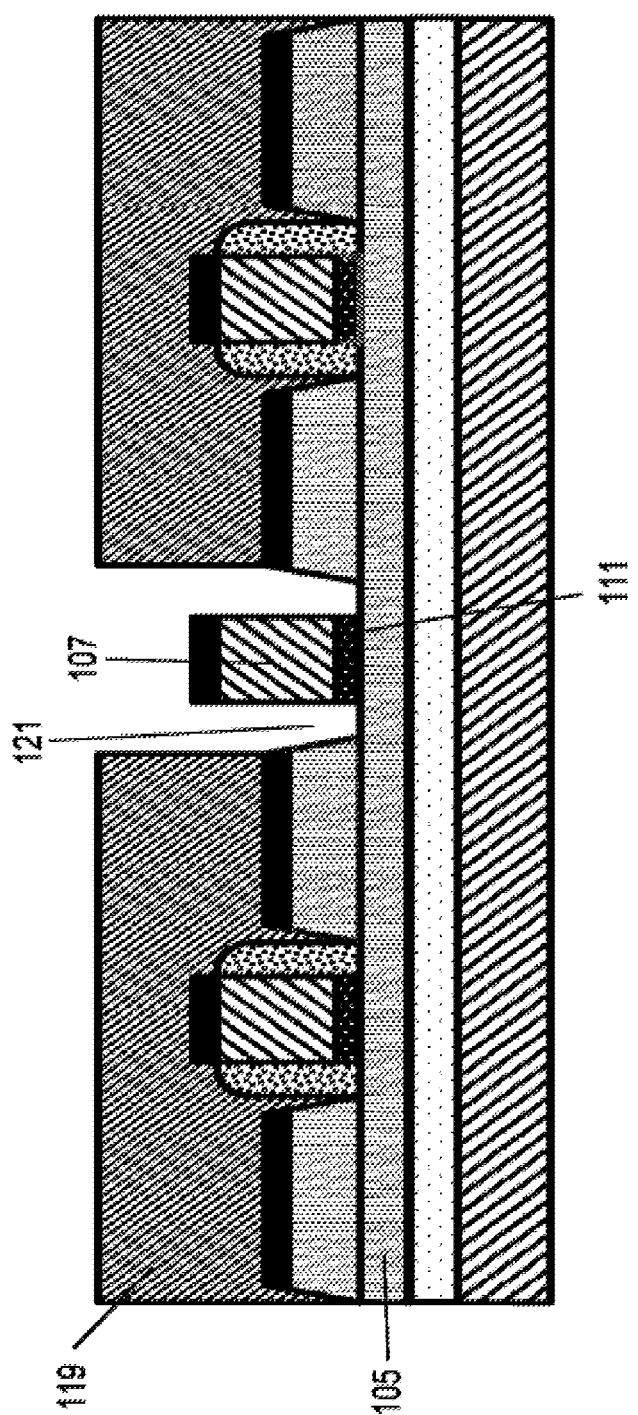

In FIG. 1B, a selective spacer etch is performed to form an additional opening 121 created by removal of spacers 115 from both sides of dummy gate 107. A reactive ion etching (RIE) of hydrogen fluoride chemistry, for example, can be used for silicon etching selective to spacers 115 (e.g., SiN spacers). The etching step in FIG. 1B stops at top silicon layer 105 and exposes sides of the gate dielectric layer 111 of dummy gate 107.

Figure 1C:
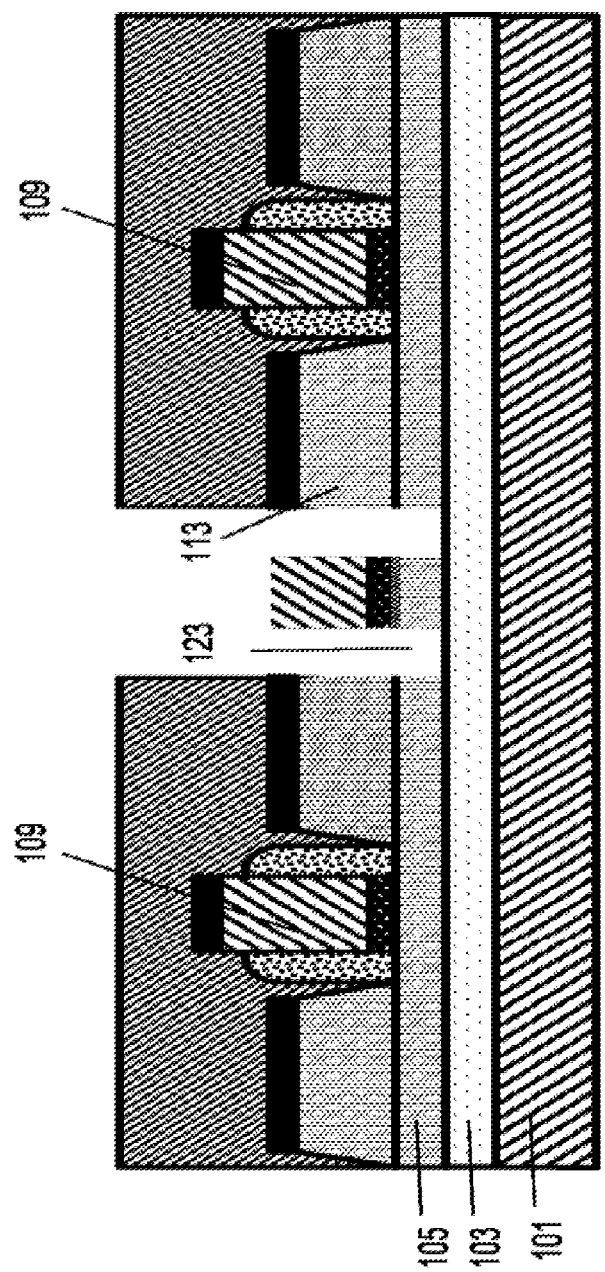

In FIG. 1C, a selective silicon etch provides a further opening 123 on both sides of the dummy gate 107 an into the SOI substrate, as well as removing a portion of the raised S/D region 113. In certain examples, etching with hydrogen bromide/chlorine chemistry followed by a RIE silicon etch extends the opening 123 down to BOX layer 103. Silicide layer 117 is removed and the height of dummy gate 107 is eroded during the etching. A physical diffusion break is created to provide isolation between the HKMGs 109.

Figure 1D:
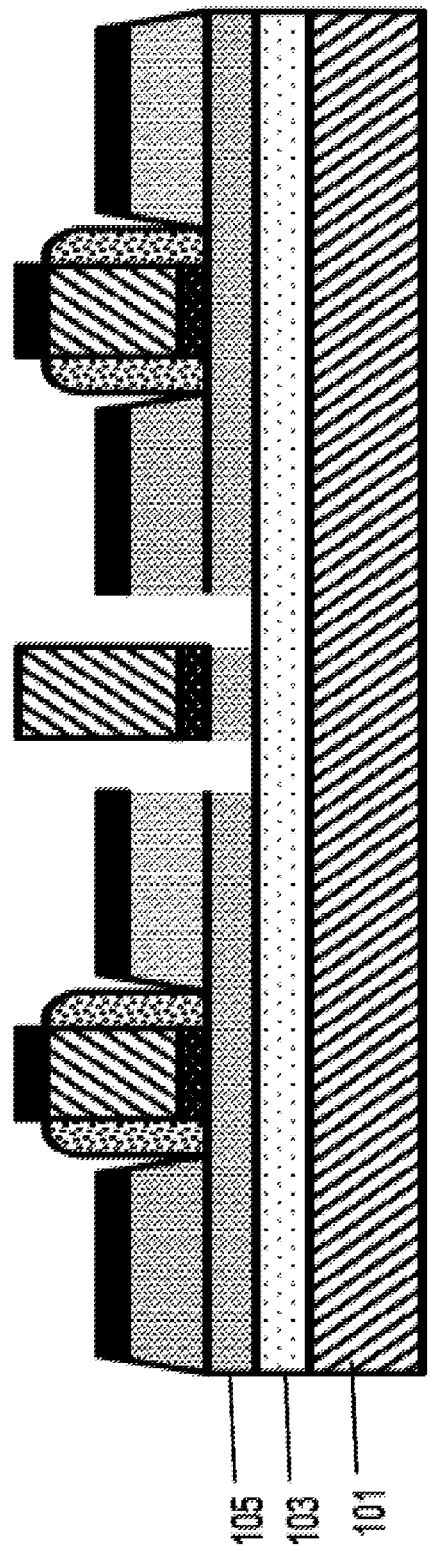

As shown in FIG. 1D, the mask 119 is removed. Removal of the mask 119 can be achieved, for example, by dry photoresist ashing using oxygen chemistry followed by sulfuric acid wet cleaning. The hard mask portion is removed, for example, by hot phosphoric acid for nitride removal.

Figure 1E:
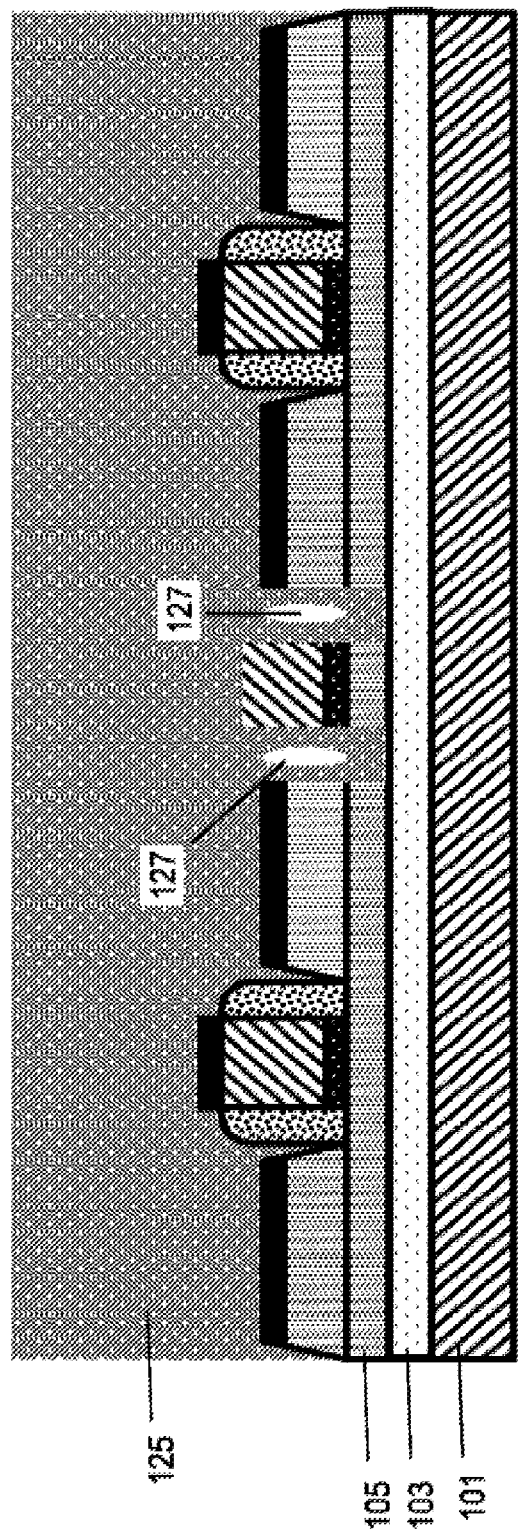

In FIG. 1E, a contact ILD 125 is deposited over the SOI substrate to a thickness of 70 nm to 150 nm over the substrate. A high density plasma chemical vapor deposition (HDP CVD) can be used to deposit the contact ILD 125 for small gaps and a high aspect ratio. The contact ILD 125 can include silicon dioxides. A chemical mechanical polishing (CMP) can be used to remove excess contact ILD 125. As shown in FIG. 1E, during deposition of the contact ILD 125, possible voids 127 can occur on open regions at sides of the dummy gate 107 due to the narrow size of the opening which can have a width of 10 nm and height of 40 nm.

Figure 1F:
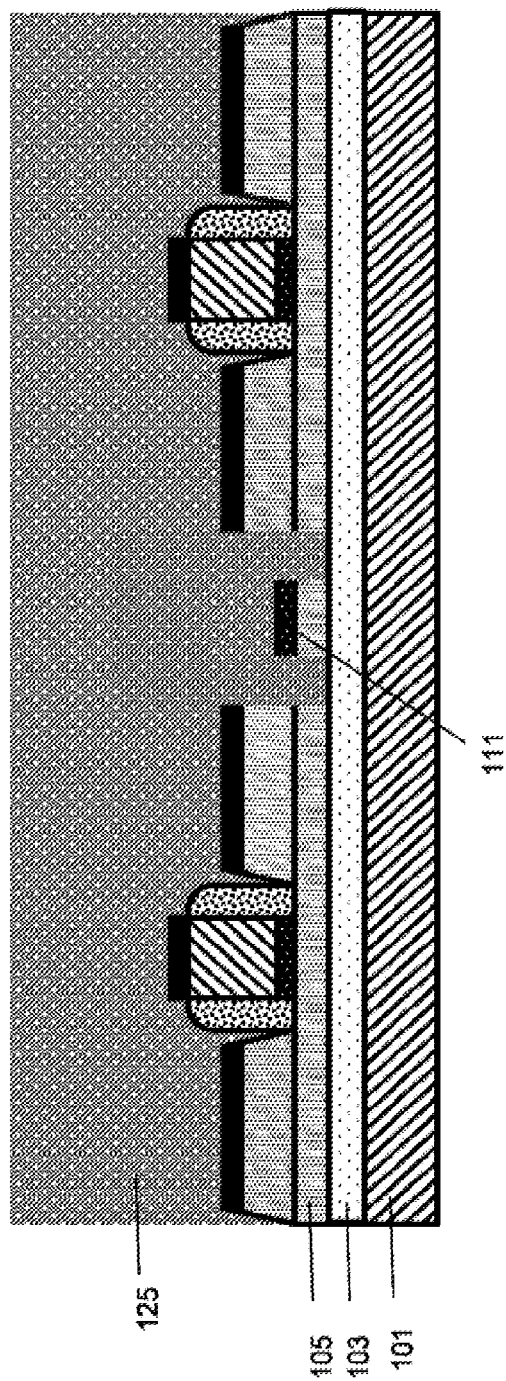

In another embodiment, as shown in FIG. 1F, in order to minimize the occurrence of voids 127, the dummy gate 107 can be removed entirely down to the gate dielectric layer 111 of dummy gate 107. The dummy gate 107 can be removed prior to the deposition of the contact ILD 125.

The embodiments of the present disclosure can achieve several technical effects, such as avoiding a crystallized high-k metal gate etch, by cutting around a dummy gate through spacers down to the SOI substrate under the spacer. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of FDSOI technology.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a silicon-on-insulator (SOI) substrate;
a dummy gate between two metal gates disposed over the SOI substrate, the dummy gate providing a physical diffusion break between the two metal gates;
raised source/drain (S/D) regions disposed on sides of the metal gates; and
interlayer dielectric (ILD) disposed over the dummy gate, raised S/D regions and metal gates and in openings on sides of the dummy gate,
wherein the ILD comprises voids on sides of the dummy gate.

2. The device according to claim 1, wherein the dummy gate comprises polysilicon.

3. The device according to claim 1, further comprising: sidewalls on sides of each metal gate.

4. The device according to claim 1, further comprising: gate dielectric layer disposed under the metal gates and the dummy gate.

5. The device according to claim 1, wherein the ILD extends into the SOI substrate below the dummy gate.

* * * * *